(12) United States Patent
Morishita

(10) Patent No.: US 6,320,211 B1
(45) Date of Patent: Nov. 20, 2001

(54) SEMICONDUCTOR DEVICE AND ELECTRONIC DEVICE BY USE OF THE SEMICONDUCTOR

(75) Inventor: Masakazu Morishita, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 08/017,411

(22) Filed: Feb. 11, 1993

Related U.S. Application Data

(63) Continuation of application No. 07/619,347, filed on Nov. 29, 1990, now abandoned.

(30) Foreign Application Priority Data

Nov. 30, 1989 (JP) .................................................... 1-311548

(51) Int. Cl.$^7$ ............................................... H01L 31/0328
(52) U.S. Cl. ........................... 257/197; 257/198; 257/51; 257/77
(58) Field of Search ................................. 257/197, 198, 257/12, 51, 77, 184

(56) References Cited

U.S. PATENT DOCUMENTS

| | | | |
|---|---|---|---|
| 4,131,902 | * 12/1978 | Kub ......................................... | 357/34 |
| 4,672,413 | * 6/1987 | Gardner ................................... | 357/34 |
| 4,959,723 | 9/1990 | Hashimoto ........................ | 358/213.11 |
| 4,983,534 | * 1/1991 | Kikuta .................................... | 357/16 |
| 5,028,973 | * 7/1991 | Bajor ...................................... | 357/34 |
| 5,094,964 | * 3/1992 | Hamasaki ............................. | 257/198 |
| 5,144,398 | * 9/1992 | Morishita ............................. | 257/198 |
| 5,283,448 | * 2/1994 | Bayraktaroglu ...................... | 257/198 |

FOREIGN PATENT DOCUMENTS 1-164177   6/1989   (JP) .

OTHER PUBLICATIONS

International Electron Devices Meeting, *Technical Digest*; Dec. 4–6, 1978, I.E.E.E., pp. 333–335, de Graaf, H., et al., "The SIS Tunnel Emitter."

Proc. Of The 1987 Bipolar Circuits And Technology Meeting, Sep. 21–22, I.E.E.E., pp. 54–56, Mertins, R., et al., "Comparsion of Advanced Emitters for High Speed Silicon Bipolar Transistors."

* cited by examiner

*Primary Examiner*—Mark V. Prenty
(74) *Attorney, Agent, or Firm*—Fitzpatrick, Cella, Harper & Scinto

(57) ABSTRACT

A semiconductor device is provided with a collector region having a first material of a first conductivity type. A base region is provided having a second material of the opposite conductivity type, and an emitter region is also provided having a third material of the first conducting type. A thin film is disposed on the emitter region for facilitating a tunnel current. A semiconductor is disposed on the thin film and has an energy band gap broader than that of the third material.

13 Claims, 6 Drawing Sheets

SEMICONDUCTOR DEVICE AND ELECTRONIC DEVICE BY USE OF THE SEMICONDUCTOR

This application is a continuation of application Ser. No. 07/619,347 filed Nov. 29, 1990 now abandoned.

BACKGROUND OF THE INVENTION

1. Field of the Invention

This invention relates to a semiconductor device and an electronic device by use of said device, more particularly to a semiconductor device with a structure of bipolar transistor structure and an electronic device utilizing the same.

2. Related Background Art

There have been known in the art devices having thin films through which tunnel current flows as a the emitter, such as bipolar transistor (BPT) with an MIS structure, a heterobipolar transistor (HBT) having a micro-crystal ($\mu$c) or an amorphous semiconductor as the emitter, etc.

In this case, in the above-mentioned BPT with MIS structure, by utilizing the difference in the tunnel probability between electrons and positive holes, the positive holes from the base are impeded by the above-mentioned thin film, thereby effecting reduction of the base current.

However, the above-mentioned BPT with the MIS structure of the prior art, for obtaining characteristics for effecting reduction of the of the above-mentioned base current, will require a necessary minimum thickness of the above-mentioned thin film. If its thickness is too thin, the inhibition ratio of positive holes will be lowered, whereby no reduction of the base current can be effected, with the result that the direct series resistance of the emitters will be increased.

Also, in the case when the difference in transmittance of positive holes and electrons is small, inhibition of positive holes cannot be accomplished. Further, although utilization of such difference in transmittance may be applicable to an npn type transistor, it is not applicable to a pnp type transistor, which is different in junction type.

On the other hand, in HBT by use of $\mu$c of the prior art, the emitter-base junction, namely the interface between the emitter by use of $\mu$c-Si and the base is unstable, and in the low current region of base current, particularly recombination becomes prevailing, whereby the current amplification ratio $h_{FE}$ will be markedly lowered.

Also, in $\mu$c-Si of the prior art, the addition of heat treatment will result in reduction of current amplification ratio $h_{FE}$ even at, for example, 450° C. Such reduction may be considered to be caused particularly by lowering in thee band gap and the elimination of H (hydrogen) contained in $\mu$c-Si, etc. because of the increased particle sic of $\mu$c-Si.

SUMMARY OF THE INVENTION

The present invention has been accomplished in view of the above-mentioned problems as described above, and its object is to provide a semiconductor device which can inhibit increase of base current in a low current region, can maintain high current amplification ratio over a broad region of collector current, and has been made applicable to junction transistors of all the types of npn and pnp, and an electronic device as its application example.

An object of the present invention is to provide a semiconductor device comprising a collector region of a first conductivity type; a base region of a second conductivity type; an emitter region of the first conductivity type; a thin film provided on said emitter region for facilitating a tunnel current; and a semiconductor material layer laminated on said thin film and having an energy band gap broader than that of a material of said emitter region, or an electronic apparatus having the semiconductor device.

DETAILED DESCRIPTION OF THE PREFERRED EMBODIMENTS

The semiconductor device accomplishing the above object is equipped with a collector region of the first conductivity type, a base region of the second conductivity type and an emitter region of the first conductivity type. The semiconductor device has a thin film provided on said emitter region through which a tunnel current can be flowed, and a semiconductor material layer which is provided on said thin film and has a forbidden band gap broader than the above-mentioned emitter region.

The semiconductor device of the present invention should desirably have the above-mentioned thin film set at a thickness which gives rise to the tunnel phenomenon with respect to the carriers of both electrons and positive holes.

Further, the semiconductor of the present invention should desirably have the above-mentioned emitter region set at a thickness thinner than the diffusion length of a small number of carriers injected from the base region.

It is preferable that the semiconductor device of the present invention should have a semiconductor layer having a proscribed band gap narrower than that of the semiconductor material layer having broad proscribed band gap which is further laminated on said semiconductor material layer.

In addition, the semiconductor device can be made an electronic device by using it in at least a photoelectric converting element.

As described above, a thin film which causes both the tunnel phenomena of positive holes and electrons to occur is formed on the $n^+$ emitter region, and further by preparation of a semiconductor material layer with broader proscribed band region than the emitter region on said thin film. In the case of the npn type BPT, inflow of positive holes can be impeded by said semiconductor material layer to effect reduction of the base current.

The film thickness of the thin film prepared on the emitter region should be desirably made 50 (Å) or less. The film thickness of the above-mentioned thin film should be preferably as thin as possible. As the thickness is thinner, the direct series resistance is lowered, whereby positive holes will also undergo the tunnel phenomenon similarly as electrons.

Also, if an emitter-base junction is prepared in single crystal, an increase of the base current in the fine current region can be suppressed.

Figure 1:
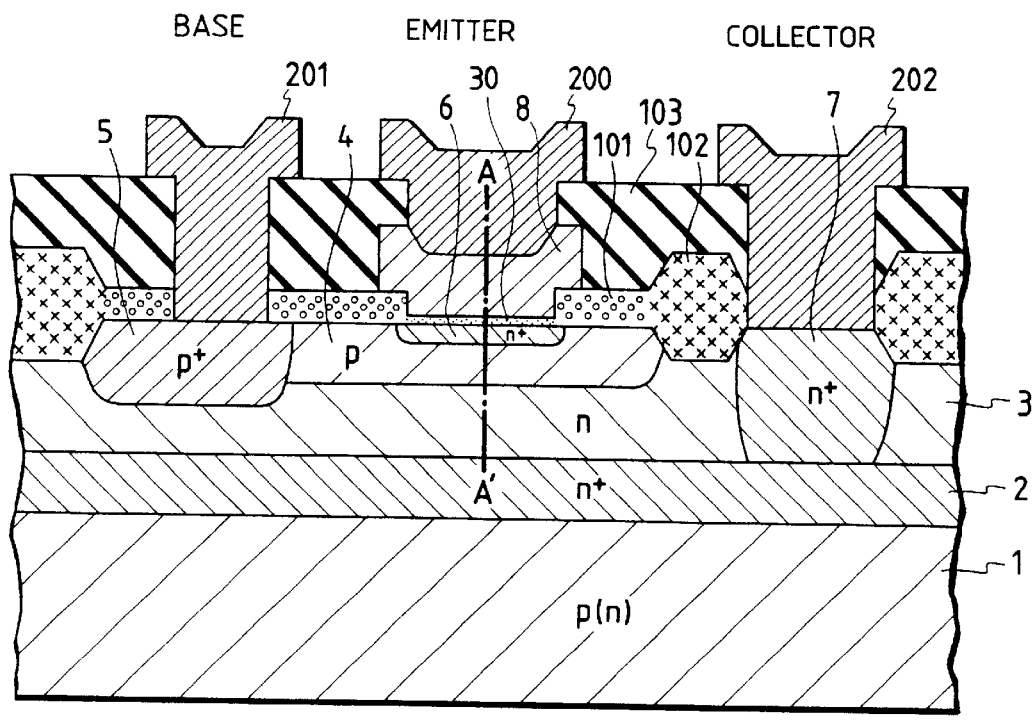
FIG. 1 is a schematic cross-sectional view of a semiconductor device for illustration of the first embodiment of the present invention.

By referring to FIG. 1, the first embodiment according to a preferred embodiment of the present invention is described.

In the same Figure, element 1 is a silicon substrate, and said substrate 1 is an n-type substrate which has been made n-type by doping of an impurity of an element of the group V of the periodic table such as phosphorus (P), arsenic (AS), antimony (Sb), etc. or a p-type substrate which has been made p-type by doping of an impurity of an element of the group III of the periodic table such as boron (B), aluminum (Al), gallium (GA), etc.

Element 2 is an $n^+$ embedded region, and said $n^+$ embedded region contains an impurity such as of P, As, Sb, etc. having an impurity concentration of $10^{16}$ to $10^{20}$ [cm$^{-3}$].

Element 3 is an n-type region as a part of the collector region, and said n-type region 3 is a region with a low impurity concentration (e.g. about $10^{13}$ to $5 \times 10^{17}$ [cm$^{-3}$]) formed by an epitaxial technique.

Element 4 is a p-type region as the base region, and said p-type region 4 is a region containing an impurity such as B, Al, Ga, etc. having an impurity concentration of $10^{15}$ to $10^{20}$ [cm$^{-3}$].

Element 5 is a $P^+$ region, and said $P^+$ region is a region containing an impurity such as B, Al, Ga, etc. having an impurity concentration of $10^{17}$ to $10^{20}$ [cm$^{-3}$] for lowering the base resistance.

Element 6 is a $n^+$ emitter region.

Element 7 is a $n^+$ region, and said $n^+$ region is provided for connecting the collector electrode 202 as described below to the above-mentioned embedded region 2 so as to lower the collector resistance.

Element 8 is a semiconductor material layer, and said semiconductor material layer 8 comprises a material having a broader proscribed bandgap as compared with the material of the above-mentioned emitter region 6, so as to impede the carriers injected from the base.

Element 30 is a thin film, and said thin film 30 comprises a thin insulating material for flowing tunnel current.

Elements 101, 102, 103 are insulating films for separation between the electrodes, elements and wirings.

Elements 200, 201, 202 are respectively emitter electrode, base electrode and collector electrode. The respective electrodes 200, 201 and 202 are formed of metals, silicides, etc.

The above-mentioned thin film 30 should be preferably made extremely thinner, thereby permitting both of electrons and positive holes to pass therethrough (not required to impede positive holes) and reducing the emitter resistance. The above-mentioned semiconductor material layer 8 comprises a material having a broad proscribed band gap, and therefore impedes minority carriers injected from the base.

Figure 2:
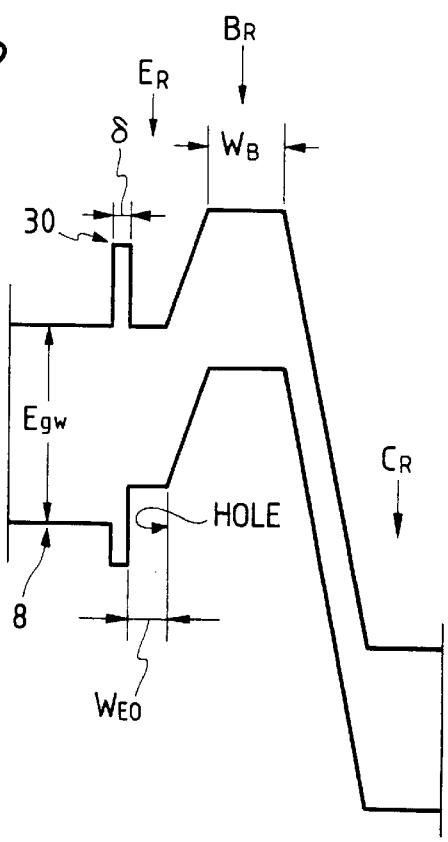
FIG. 2 is a diagram showing the potential along the line A-A' in FIG. 1.

FIG. 2 shows the potential diagram at the cross-section A-A' in FIG. 1.

In the same Figure, $W_B$ shows the neutral region width of the base $W_{EO}$, the neutral region width of the emitter, and $\lambda$ the thickness of the thin film 30.

The greatest characteristic function of the above-mentioned thin film 30 is to separate the above-mentioned semiconductor material layer 8 from the single crystal in the emitter region 6, thereby effecting stabilization of said semiconductor material layer 8. More specifically, when the respective regions of emitter-base-collector use Si as the substrate, if a microcrystal ($\mu c$) having a proscribed band gap Si is chosen as the semiconductor layer 8, when the above-mentioned thin film 30 is not formed, due to the heat treatment after formation of said $\mu c$-Si, an epitaxial growth starts from a monocrystal substrate a crystal formed at a boundary is changed, whereby lowering of the current amplification ratio $h_{FE}$. Further, partial epitaxial growth occurs. Variation in BPT property becomes significantly greater. By provision of the thin film 30, the element characteristics can be prevented from the influences due to change that in the crystal form of $\mu c$ does not occur.

On the other hand, if a polycrystal of GaAs is chosen as the semiconductor material layer 8, because Ga or As is an impurity for Si which is the substrate material, its electro-conductive characteristics will be changed. Thus, the thin film 30 can impede diffusion of the impurity, or even if cannot impede, can reduce such diffusion.

As the above-mentioned semiconductor material layer 8, SiC, etc. can be also employed. As the crystal form of the semiconductor material layer 8, all of amorphous, polycrystalline and single crystal forms are applicable.

As the thin film 30 causing the tunnel phenomenon to occur, chemically stable materials are preferable, such as $SiO_2$, $Si_3N_4$, $Al_2O_3$, etc. The material is not limited to insulating materials, but semiconductors such as SiC, etc. may be also employed.

The crystal form may be amorphous, polycrystal, or mono-crystal, while, for the purpose of dividing the areas 8 and 6, the amorphous would be more preferable. However, in choosing these materials, materials which may have deleterious effects on the substrate material should be avoided as a matter of course.

The thin film 30 may be essentially equal to or narrower than the energy gap of the substrate material. In this case, no tunnel barrier as shown in FIG. 2 will exist.

Figure 3A:
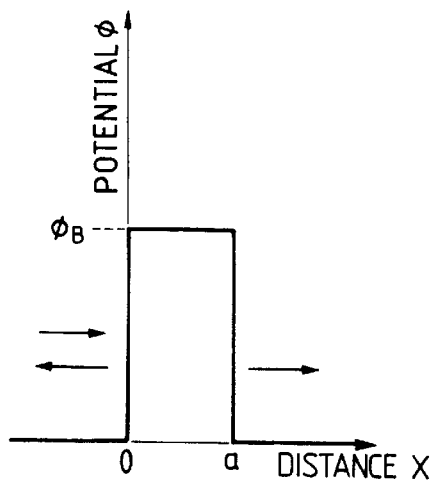
FIG. 3A is an illustrative diagram showing the relationship between potential and distance for illustration of the tunnel film.

Next, the above-mentioned tunnel effect is to be described. When electrons from the semiconductor material layer 8 pass through the emitter region $E_R$ shown in FIG. 2, it can be described by referring to a model of barrier potential as shown in FIG. 3. Here, when $\phi_B$ is defined as the barrier height and a as the barrier width, the tunnel probability $T_t$ of the electron with an energy E having an effective mass m* becomes as follows from the Schrodinger's equation:

$$T_t = \left[1 + \frac{\phi_B^2 \sinh^2 \beta a}{4E(\phi_B - E)}\right]^{-1} \quad (1)$$

wherein $$\beta = \left[\frac{2m^*(\phi_B - E)}{\hbar^2}\right]^{1/2} \quad (2)$$

Here, if $\phi_B \gg E$, $\beta a \ll 1$, $T_t$ becomes as follows:

$$T_t = 16 \frac{E}{\phi_B} \exp(-2\beta a) \quad (3)$$

wherein $$\beta \cong (2m^* \phi_B)^{1/2}/\hbar \quad (4)$$

Figure 3B:
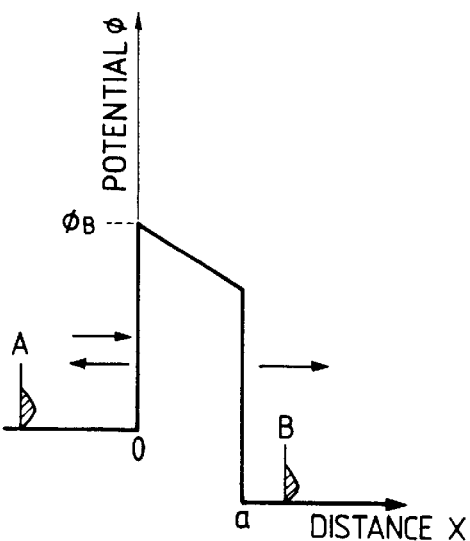
FIG. 3B is an illustrative diagram showing the relationship between potential and distance when a corresponding voltage is applied on the tunnel film.

Next, when a voltage is applied, the potential becomes inclined in the thin film 30 as shown in FIG. 3B, whereby the tunnel probability $T_t$ is increased.

Here, the total tunnel current $I_{ct}$ may be speculated as follows:

$$I_{ct} \cdot A \int_x^\infty F_{c1}(E) n_{c1}(E) T_t (1 - F_{c2}(E)) n_{c2}(E) dE \quad (5)$$

In the above formula, A is a constant, $T_t$ the tunnel probability in the above formula (1), $F_{c1}$, $F_{c2}$ are Fermi-Dirac distribution functions of the above-mentioned semiconductor material layer 8 and the emitter region $E_R$, and $n_{c1}$, $n_{c2}$ represent the state densities of the conduction bands of said both materials.

In the foregoing formula (5) when $\phi_B \gg E$, the item concerned with the thickness of the thin film 30 comes outside of the object to be integrated, becoming as follows:

$$I_{ct} \exp(-2\beta a) \quad (6)$$

whereby it can be understood that an expotential functional effect occurs in the thickness of the thin film 30. Thus, the thickness contributes most greatly to the electron tunnel current $I_{et}$.

In the foregoing formula (5), another important item is the following item:

$$F_{c1}(1-F_{c2}) \quad (7)$$

wherein $F_{c1}$ denotes a probability of existence of electron at a since of A, $(1-F_{c2})$ denotes a probability of inexistence of electron at a side of B, and a product thereof would greatly effect on an electron transition, but for increasing the item of this product, a voltage corresponding to about kT or higher may be applied on the thin film 30, and, for example, it may be about 0.025 V at room temperature.

In the case of BPT, the voltage drop in the above-mentioned thin film 30 is about the above-mentioned voltage value and, as shown in FIG. 3B, during voltage application, the existing probability is shifted in energy as shown by A, B, whereby in the energy band having the same energy as the energy of electrons on the side of the semiconductor material layer 8 (the left side in FIG. 3B), there exists no electron on the emitter side (right side in FIG. 3B) and transition of electrons can be readily effected. Also, by voltage application on the thin film 30, the barrier height is slightly reduced.

In the present invention, as shown in FIG. 2, both the thickness $W_{EO}$ of the emitter region $E_R$ and the concentration N are important factors for reducing the base current.

Usually, the above-mentioned thin film 30 has a thickness of 50 [Å] or less, which is comparatively smaller than the thickness of the n$^+$ emitter region 6, and the distance $W_E$ from the emitter-base junction portion of the semiconductor material layer 8 is represented by:

$$W_E \cong W_{EO} + \delta \quad (8)$$

and becomes substantially equal to $W_{EO}$.

A minimum limit of a thickness of the film 30 in desirably 2~3 Å. Further preferably, in case of $SiO_2$, the film 30 is a mono-atom layer with uniformly distributed 0.

On the other hand, another important factor in the present invention, namely an impedance of minority carriers injected from the base, is effected at the interface between the semiconductor material layer 8 and the thin film 30. Of course, since the tunnel probability for electrons and positive holes in the thin film 30 is greater for electrons, the reduction effect of the base current by positive holes is obtained as the overlapping action of the both.

Next, the constituents of the current of the above-mentioned BPT are to be described.

The collector current Jc is approximately represented by the following formula (9):

$$J_c = \frac{q \cdot D_n \cdot n_i^2}{N_B \cdot W_B} \left\{ \exp\left(\frac{V_{BE}}{kT}\right) - 1 \right\} \quad (9)$$

wherein the diffusion distance is made longer than the base width. $N_B$ is the base concentration, $W_B$ the base width, $D_n$ the diffusion distance of electrons, $n_i$ the intrinsic carrier density and $V_{BE}$ the base-emitter applied voltage.

On the other hand, the base current comprises the recombination current $J_{Brec}$ in the base and the diffusion current $J_{Bdiff}$ of the positive holes injected from the base into the emitter.

Here, the recombination current $J_{Brec}$ is represented by:

$$J_{Brec} = \frac{q \cdot D_n \cdot n_i^2 \cdot W_B}{2 N_B \cdot L_n^2} \left\{ \exp\left(\frac{V_{BE}}{kT}\right) - 1 \right\} \quad (10)$$

wherein $L_n$ is the diffusion distance of electrons.

In the homo-junction form BPT of the prior art, $J_{Bdiff}$ is the main component, and no high current gain can be obtained.

The diffusion current $J_{Bdiff1}$ in the homo-BPT of the prior art when the diffusion length $L_P$ of the positive holes is smaller than the emitter thickness $W_E$ (case 1) ($L_P \ll W_E$) is represented by:

$$J_{Bdiff1} = \frac{q \cdot D_P}{L_P} \cdot \frac{n_i^2}{N_E} \left\{ \exp\left(\frac{V_{BE}}{kT}\right) - 1 \right\} \quad (11)$$

On the other hand, when shallowing of the emitter junction accompanied by higher integration is effected, the relationship becomes $L_P \gg W_E$ (case 2), whereby the diffusion current $J_{Bdiff2}$ is represented by:

$$J_{Bdiff2} = \frac{q \cdot D_P}{W_E} \cdot \frac{n_i^2}{N_E} \left\{ \exp\left(\frac{V_{BE}}{kT}\right) - 1 \right\} \quad (12)$$

Therefore, the diffusion current becomes further greater, whereby the current amplification ratio $h_{FE}$ of BPT is reduced.

In the case of the present invention, when the recombination speed at the hetero-interface is made a negligible value, the diffusion current $J_{Bdiff3}$ is represented by the following formula (13) ($L_P \gg W_E$):

$$J_{Bdiff3} q \frac{D_P \cdot W_E}{L_P^2} \cdot \frac{n_i^2}{N_E} \left\{ \exp\left(\frac{V_{BE}}{kT}\right) - 1 \right\} \quad (13)$$

In BPT of the present invention, in the above-mentioned case 1, the diffusion current $J_{Bdiff}$ becomes $W_E/L_B$-fold relative to the homo-junction form BPT of the prior art.

Further, relative the above-mentioned case 2, the diffusion current $J_{Bdiff}$ becomes $(W_E/L_P)^2$-fold.

Thus, in the present embodiment, the diffusion current $J_{Bdiff}$ can be dramatically reduced. In other words, the current amplification ratio $h_{FE}$ can be dramatically increased.

In the MIS structure BPT of the prior art, there exists no diffusion $J_{Bdiff}$ because $W_E=0$, but other current components exist.

Figure 4:
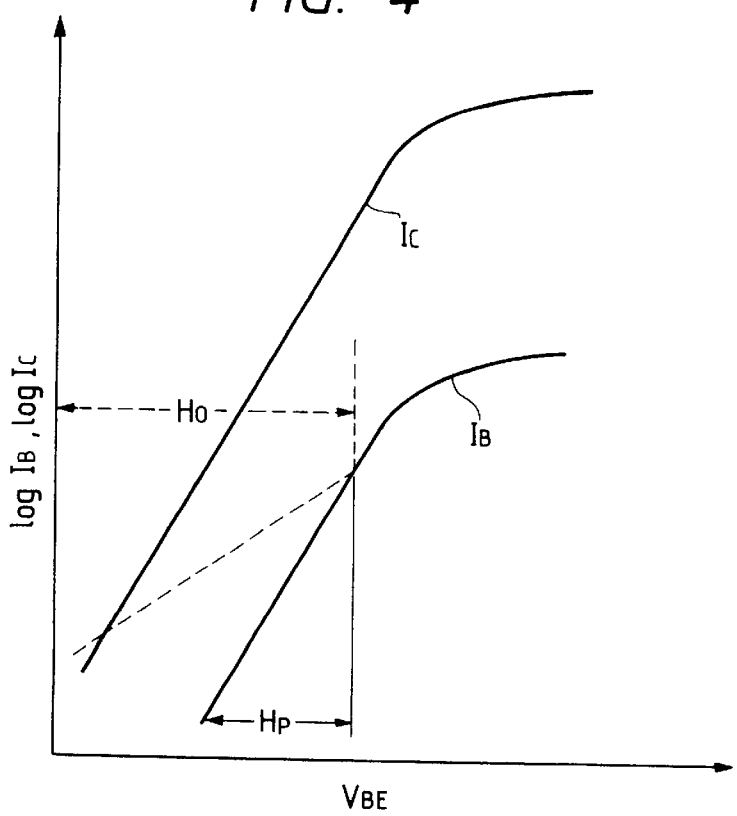
FIG. 4 is a graph for comparison of voltage, current between the transistor according to the present invention and the transistor of the prior art.

FIG. 4 is a graph showing schematically the current-voltage characteristics of the transistor, the axis of abscissa showing the applied voltage between the base-emitter, the axis of ordinate the base current $I_B$ and the collector current $I_c$ represented in logarithmic values. In the BPT of the present invention, the collector current $I_c$ and the base current $I_B$ become substantially in parallel to each other, and also in the fine current region ($H_P$), the current amplification ratio $n_{FE}$ (=$I_C/I_B$) becomes a constant value, but in the MIS structure BPT of the prior art, excessive current flows in the fine current region ($H_o$).

The base current in the BPT according to the present invention is primarily the recombination current represented by the above formula (10), and the maximum value $h_{FEmax}$ of the current amplification ratio in this case is as follows:

$$h_{FEmax} = 2(L_n/W_B)^2 \quad (14)$$

and the upper limit of $h_{FE}$ is determined only by the base conditions. According to the present invention, $h_{FE}$ becomes 10000 or higher.

Figure 5:
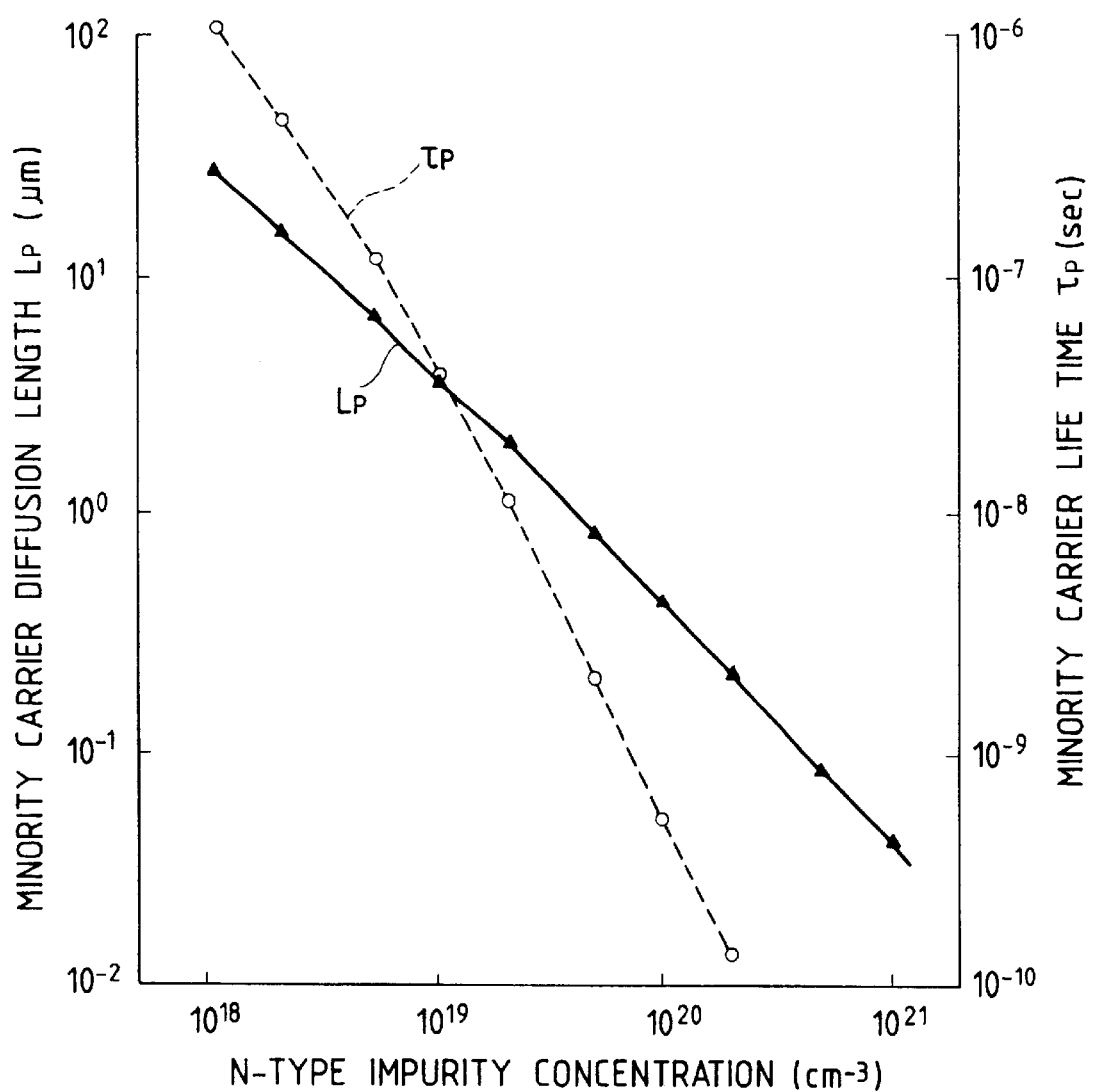
FIG. 5 is a graph showing the relationship between the impurity concentration and the life of positive holes in the emitter region.

FIG. 5 shows the relationships between the impurity concentration in the above-mentioned $n^+$ emitter region 6 and the diffusion distance $L_p$ of the minority carriers (positive holes) and the life $\tau_P$ of said minority carriers (positive holed). According to a condition determined by the formula (13), it is preferable that the emitter depth should be made at least about ⅕ of the diffusion distance of positive holes.

Next, the preparation process of the semiconductor device shown in FIG. 1 is to be described.

(1) On a substrate 1 of a predetermined conduction type (p-type or n-type is formed an $n^+$ embedded region 2 with an impurity concentration of $10^{15}$ to $10^{19}$ [cm$^{-3}$] by ion injection (or impurity duffusion, etc.) of As, Sb, P, etc.

(2) By epitaxial technique, etc. an n-type region 3 with an impurity concentration of $10^{14}$ to $10^{17}$ [cm$^{-3}$] is formed.

(3) An $n^+$ region 7 for reducing the resistance of the collector (with an impurity concentration of $10^{17}$ to $10^{20}$ [cm$^{-3}$]) is formed.

(4) An insulation film 102 for element separation is prepared by the selective oxidation method or the CVD method, etc.

(5) In the active region, a $p^+$ region 5 and a p region 4 which are the base region are formed by the ion injection method, etc.

(6) After opening of an emitter contact on the insulation film 101, an $n^+$ emitter region doped with As, Sb, P, etc. (impurity concentration $5\times10^{17}$ to $5\times10^{20}$ [cm$^{-3}$]) is formed by the ion injection method or the thermal diffusion method.

(7) A thin film 30 is prepared by oxidation at lower temperature of 500° C. to 650 [° C.] or by thermal oxidation by rapid thermal acceleration (RTA).

(8) After deposition of a microcrystal Si doped to $n^+$ according to the plasma CVD method on the above-mentioned thin film 30, it is subjected to patterning.

(9) An insulation film 103 is deposited, which is annealed and then subjected to opening of contact.

(10) an Al—Si (1%) which becomes the electrode 200 is subjected to spurttering, followed by patterning of the Al—Si.

(11) After alloy formation of the Al—Si electrode, a passivation film is formed.

According to the procedure as described above, an MIS structure BPT is completed.

As the above-mentioned thin film 30, a silicon oxide film is the optimum, because it can be easily formed at low temperature, but an insulation film such as silicon nitride film, alumina film, etc. may be also employed.

Also, by use of SiC, etc., a structure which becomes the tunnel type barrier may be formed. Explanation will made with regard to an example of mono-crystal. For example, SiC, as compared with Si has a conduction band energy difference $\Delta E_v \approx 0.53$ [eV], a valence electron band difference $\Delta E_c \approx 0.55$ [eV] and a band gap $E_q \approx 2.2$ [eV], and when both SiC and Si are junctioned stepwise in n-type, it becomes to have a structure different from the semiconductor/insulator junction.

Figure 6A:
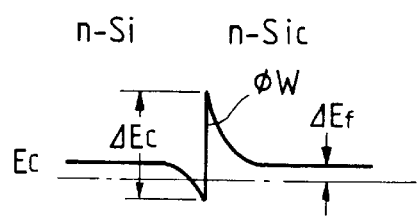
FIG. 6A is an illustrative diagram showing the energy level of junction of the n-type Si and the n-type Sic.
Figure 6A:
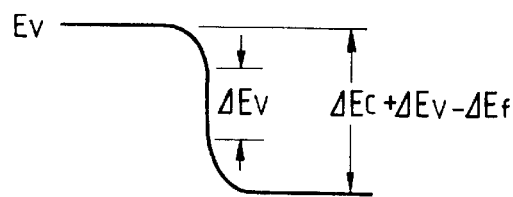
Figure 6B:
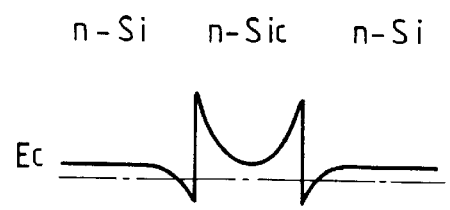
FIG. 6B is an illustrative diagram showing the energy level of junction of the n-type Si, the n-type SiC and the n-type Si.
Figure 6B:
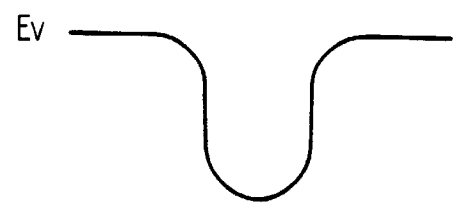
Figure 6C:
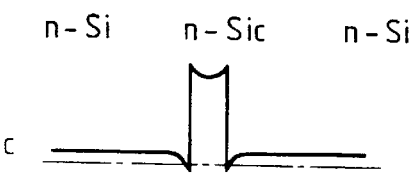
FIG. 6C is an illustrative diagram showing the energy level of the n-type Si, the n-type SiC of the thin film and the n-type Si.
Figure 6C:

FIGS. 6A, 6B, 6C show a band structure of hetero-junction mutually of the same conduction type (n-type in this case), namely the isotype.

FIG. 6A shows the junction of the n-type Si and the n-type SiC, $\Delta E_c$, $\Delta E_v$ appearing respectively above and below, and a barrier $\phi_W$ called notch being formed on the conduction band side, while on the valence electron side, an energy difference of the following is created:

$\Delta E_c + \Delta E_v - \Delta E_f$.

On the other hand, by junction of the n-type Si, the n-type SiC and the n-type Si, the energy level becomes as shown in FIG. 6B.

Further, by forming SiC into a thin film, the SiC will be depeleted to become similar to an insulation material, whereby the potential distribution becomes as shown in FIG. 6C.

With the structure shown in FIG. 6C, the electron current can be made greater. In FIG. 6A to FIG. 6C, an example by use of SiC is shown, but it will be apparent that other materials with broad forbidden band gap can be also employed.

A crystal structure of the tunnel film may be mono-crystal, polycrystal, or amorphous.

Figure 7:
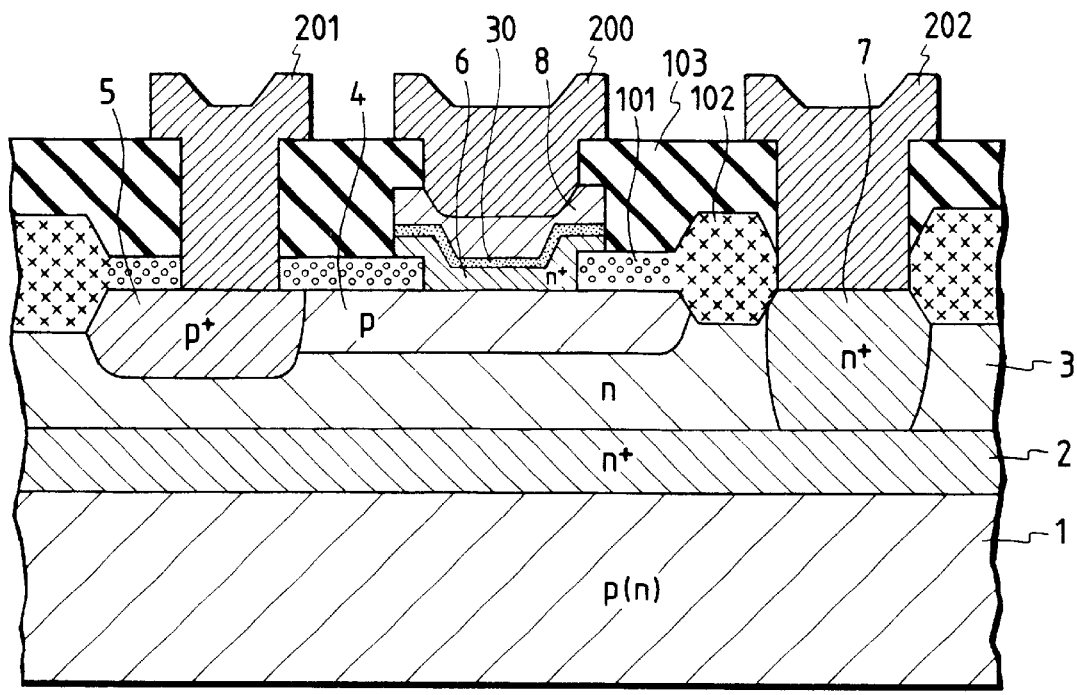
FIG. 7 is a schematic cross-sectional view for illustration of the second embodiment of the present invention.

Next, by referring to FIG. 7, a preferable second embodiment of the semiconductor device of the present invention is to be described. In this embodiment, an emitter region 6 is formed by epitaxial growth on the base region (p-type region 4), and on the emitter region 6 is formed a thin film 30 for tunnel. By making such structure, it becomes that $W_E$ 0 in the above-mentioned formula (13), whereby it becomes possible to a current amplification ratio which is approximate to the above-mentioned maximum amplification ratio $h_{FEmax}$.

Figure 8:
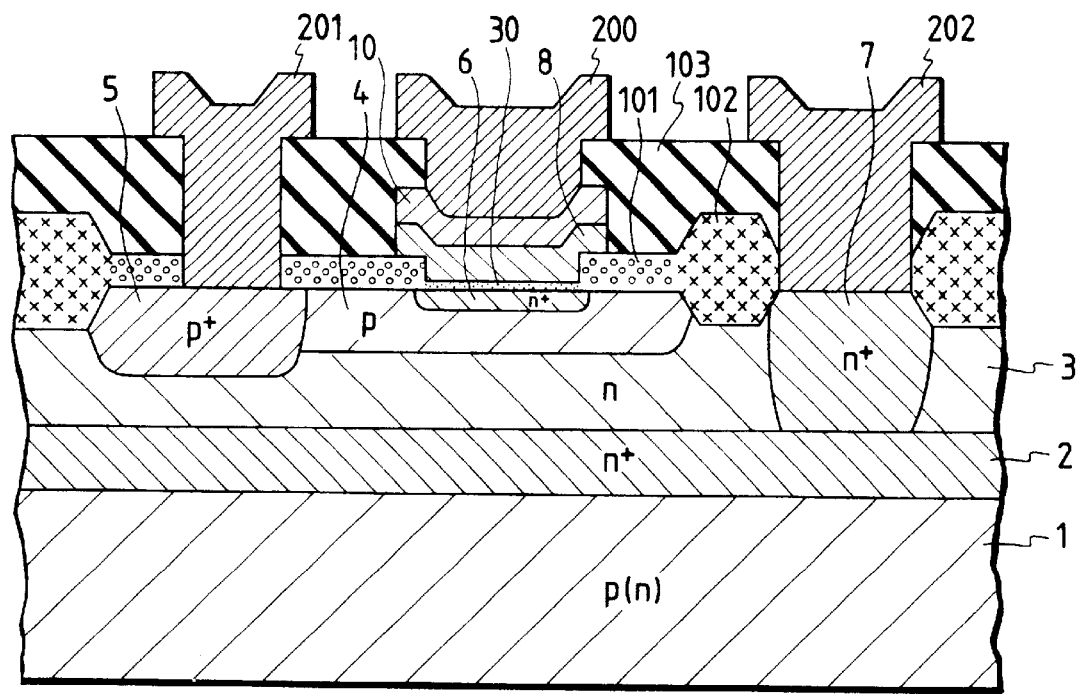
FIG. 8 is a schematic cross-sectional view for illustration of the third embodiment of the present invention.

Next, by referring to FIG. 8, a preferable third embodiment of the semiconductor device of the present invention is to be described. This embodiment is different from the above-described first embodiment in that a semiconductor material layer 8 is formed on the thin film 30 and a semiconductor layer 10 of a material with broader forbidden band gap than said semiconductor material layer 8 is further formed on said semiconductor material layer 8. With such construction, in this embodiment, ohmic resistance between the emitter and the metal is improved. If the semiconductor material layer 8 is SiC, the semiconductor layer 10 should be preferably selected as Si, while if the semiconductor material layer 8 is Si, the semiconductor layer 10 should be preferably selected as Ga, etc.

The conduction type of the semiconductor layer 10 is the same as that of the semiconductor material layer 8.

Figure 9:
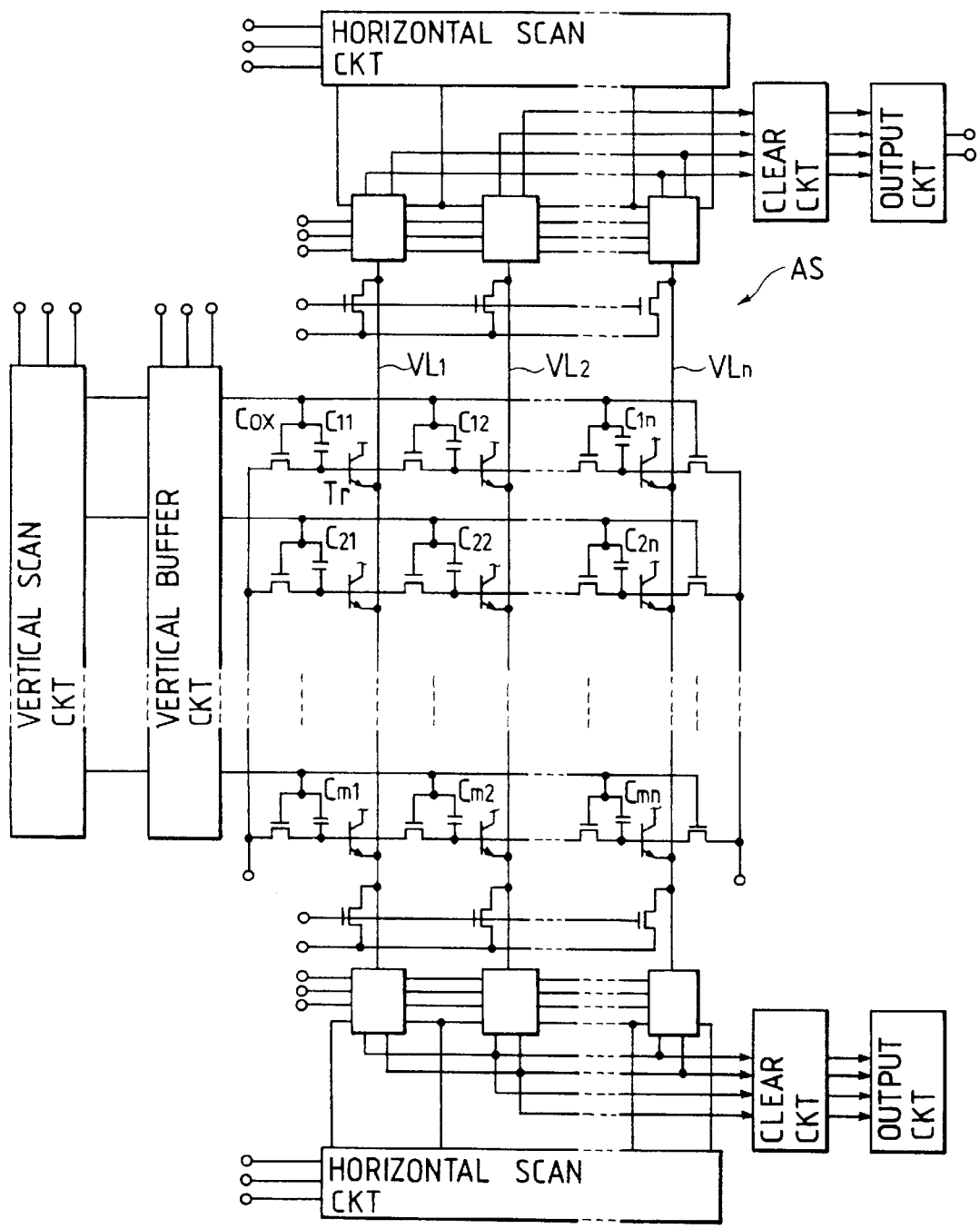
FIG. 9 is a circuit diagram showing an embodiment of the electronic device by use of the above-mentioned semiconductor device according to the present invention.

FIG. 9 is a circuit example showing an example of the electronic device as an application example of the semiconductor device according to the above-mentioned embodiment. It shows the case when the BPT shown in the above-described embodiment 1 is used in the solid image pick-up device disclosed by the present Applicant in Japanese Patent Application No. 62-321423.

More specifically, in FIG. 9, the transistor Tr constituting the sensor cells $C_{11}$, $C_{12}$, . . . $C_{mn}$ of the area sensor AS employs the MIS type BPT shown in the above-described first embodiment.

When the area sensor AS shown in FIG. 9 is used as a color camera, the actuation of reading optical informations of the same photoelectric converting device for plural times is performed.

As described above, according to the present invention, since $C_{tot}=10$ [pF], $C_v=2.5$ [pF], in the collector region of the first conduction type and the base region of the second conduction type, for example, for making the non-destruction degree 0.90 or higher, $h_{FE}$ is required to be 2250 or higher. For obtaining sufficient non-destruction degree, it may be estimated that $h_{FE}$ is required to be 2000 or higher.

In contrast, in the prior art, for example, in homo-junction BPT, $h_{FE}$ is about 1000, and hence no sufficient non-destruction degree can be obtained, while in the present invention, excellent non-destruction degree can be obtained because $h_{FE}$ can be made sufficiently great in the semiconductor device of the present invention.

Further, desirably, the non-destruction degree should be 0.98 or higher. In this case, $h_{FE}$ is required to be about 10000 or more, but it is difficult to obtain such a value in the homo-junction BPT or the prior art.

In the embodiment shown in FIG. 9, an area sensor was exemplified, but the present invention is also applicable to a line sensor as a matter of course.

Also, the transistor in FIG. 9 can also apply the second and third embodiments as described above.

Also in this case, excellent non-destructive reading can be done.

In this case, for reading for plural times from the same element, the ratio of the electrical output during the first reading to that during the second reading and thereafter is a problem, and correction is required when the value of this ratios has become smaller.

When the ratio of the first reading output to the second is defined as the non-destruction degree, the non-destruction degree is represented by the following formula:

Non-destruction degree=$(C_{tot} \times h_{FE})/(C_{tot} \times h_{FE}+C_v)$.

Here, $C_{tot}$ indicates the total capacity the transistor Tr shown in FIG. 9 connected to the base, which is determined by the base-collector capacity $C_{bc}$ and $C_{ox}$. $C_v$ is the floating capacity of the reading line shown by $VL_1$ . . . $VL_n$. However, $C_{ox}$ may not sometimes exist depending on the circuit system.

Therefore, the above-mentioned non-destruction degree can be easily improved by increasing the current amplification ratio $h_{FE}$. Thus, by making $h_{FE}$ greater, the non-destruction degree can be made greater.

Here, the constitution is made to have an area sensor region corresponding to HD (High Division), namely corresponding to high vision, an emitter region of the first conduction type, a thin film provided on said emitter region capable of flowing tunnel current and a semiconductor material layer laminated on said thin film and having a broad forbidden band gap than at least the above-mentioned emitter region, and therefore, it is possible to suppress increase of the base current at the fine current region of the collector current, whereby markedly high current amplification ratio can be maintained over a wide region of the collector current and dependency of the current amplification ratio on the collector current can be avoided. Due to the intervening presence of the thin film, there becomes no interference between the semiconductor material layer having a broad forbidden band gap and the emitter region, whereby stabilization of said semiconductor material can be effected.

Also, by setting the above-described thin film at a thickness which causes tunnel phenomena for both of electrons and positive holes to occur, reduction of the emitter resistance can be effected.

Further, by making the emitter region to have a thickness thinner than the diffusion length of minority carriers injected from the above-mentioned base region, the current amplification ratio can be further dramatically increased.

In addition, in the semiconductor device of the present invention, by laminating a semiconductor layer having a narrower forbidden band gap on the above-mentioned semiconductor material layer with broad forbidden band gap as compared with its forbidden band gap, the ohmic resistance between the emitter region and the metal can be further reduced.

By use of the semiconductor device of the present invention as a photoelectric converting element, the current amplification ratio of the transistor as said photoelectric converting element can be improved and also dependency of the current amplification ratio on the collector current can be eliminated, whereby the linearity of the output relative to the optical input can be maintained to provide an electronic device with little dark current and high signal/noise ratio (S/N ratio).

What is claimed is:

1. A semiconductor device comprising:
   a semiconductor material including:
      a collector region of a first conductivity type;
      a base region of a second conductivity type opposite to the first conductivity type, said base region being provided in contact with said collector region; and
      an emitter region of the first conductivity type provided in contact with said base region;
   an insulating material provided on said emitter region, said insulating material having (a) an insulating thin film portion for permitting a tunnel current of an electron and a hole to flow therethrough, said insulating thin film portion being provided on said emitter region, and (b) an insulating layer portion having a thickness larger than said insulating thin film portion, said insulating layer portion being provided adjacent said insulating thin film portion on a region including at least a part of said emitter region; and
   a layer of another semiconductor material provided at least on said insulating thin film portion, said layer of said another semiconductor material having an energy band gap broader than the semiconductor material forming said emitter region.

2. A semiconductor device according to claim 1, wherein a thickness of said thin film is selected so that a tunnel effect occurs for electron carriers and hole carriers.

3. A semiconductor device according to claim 1, wherein the thickness of said thin film is at most 50 Å.

4. A semiconductor device according to claim 1, wherein said semiconductor region includes monocrystalline silicon.

5. A semiconductor device comprising:
a semiconductor material including:
a collector region of a first conductivity type;
a base region of a second conductivity type opposite to the first conductivity type, said base region being provided in contact with said collector region; and
an emitter region of the first conductivity type provided in contact with said base region:
an insulating thin film for permitting a tunnel current of an electron and a hole to flow therethrough, said insulating thin film being provided on said emitter region;
an insulating layer formed of an insulating material provided adjacent said insulating thin film on a region including at least a part of said emitter region; and
a layer of another semiconductor material provided on said insulating thin film, said layer of said another semiconductor material having an energy band gap broader than the semiconductor material forming said emitter region,
wherein said layer of said another semiconductor material having the broader energy band gap comprises a material selected from the group consisting of microcrystalline silicon, GaAs and SiC.

6. A semiconductor device according to claim 1, wherein said semiconductor material of the broader energy band gap includes a material selected from the group consisting of amorphous semiconductor materials, polycrystalline semiconductor materials, and monocrystalline semiconductor materials.

7. A semiconductor device according to claim 1, wherein said thin film includes a material selected from the group consisting of $SiO_2$, $Si_3N_4$, $Al_2O_3$ and SiC.

8. A photovoltaic conversion device comprising:
a semiconductor material including:
a collector region of a first conductivity type;
a base region of a second conductivity type opposite to the first conductivity type, said base region being provided in contact with said collector region; and
an emitter region of the first conductivity type provided in contact with said base region;
an insulating material provided on said emitter region, said insulating material having (a) an insulating thin film portion for permitting a tunnel current of an electron and a hole to flow therethrough, said insulating thin film portion being provided on said emitter region, and (b) an insulating layer portion having a thickness larger than said insulating thin film portion, said insulating layer portion being provided adjacent said insulating thin film portion on a region including at least a part of said emitter region; and
a layer of another semiconductor material provided at least on said insulating thin film portion, said layer of said another semiconductor material having an energy band gap broader than the semiconductor material forming said emitter region.

9. A semiconductor device according to claim 1, wherein said layer of said another semiconductor material is further provided on said insulating layer portion adjacent said insulating thin film portion.

10. A photovoltaic conversion device according to claim 8, wherein said layer of said another semiconductor material is further provided on said insulating layer portion adjacent said insulating thin film portion.

11. A semiconductor device according to claim 5, wherein said insulating thin film has a thickness of 50 Å at most.

12. A semiconductor device according to claim 5, wherein said semiconductor material comprises single-crystalline silicon.

13. A semiconductor device according to claim 5, wherein said insulating thin film comprises a material selected from the group consisting of $SiO_2$, $Sl_3N_4$ and SiC.

* * * * *

UNITED STATES PATENT AND TRADEMARK OFFICE
CERTIFICATE OF CORRECTION

PATENT NO. : 6,320,211 B1
DATED : November 20, 2001
INVENTOR(S) : Masakazu Morishita It is certified that error appears in the above-identified patent and that said Letters Patent is hereby corrected as shown below:

Title page,
Item [57] ABSTRACT,
Line 5, "conducting" should read -- conductivity --.

Column 1,
Line 16, "a" should be deleted;
Line 17, "bipolar" should read -- a bipolar --;
Line 49, "thee" should read -- the --;
Line 51, "sic" should read -- size --.

Column 2,
Line 26, "Sic;" should read -- SiC; --;
Line 35, "and" should be deleted;
Line 37, "invention." should read -- invention; and --.

Column 3,
Line 29, "arsenic (AS)," should read -- arsenic (As), --;
Line 33, "gallium (GA)," should read -- gallium (Ga), --;
Line 57, "bandgap" should read -- band gap --.

Column 4,
Line 12, "$\lambda$" should read -- $\delta$ --;
Line 37, "cannot" should read -- it cannot --.

Column 5,
Line 24, "$I_{ct} \bullet A$" should read -- $I_{ct}=A$ --;
Line 35, "$I_{ct} \exp(-2\beta a)$" should read -- $I_{et} \propto \exp(-2\beta a)$ --.

Column 6,
Line 8, "distributed 0." should read -- distributed O. --.

Column 7,
Line 3, "$J_{Bdiff3} q \dfrac{D_P \bullet W_E}{L_P^2}$" should read -- $J_{Bdiff3} \dfrac{q D_P \bullet W_E}{L_P^2}$ --;

UNITED STATES PATENT AND TRADEMARK OFFICE
CERTIFICATE OF CORRECTION

PATENT NO.   : 6,320,211 B1
DATED        : November 20, 2001
INVENTOR(S)  : Masakazu Morishita It is certified that error appears in the above-identified patent and that said Letters Patent is hereby corrected as shown below:

Column 7 (continued),
Line 8, "relative" should read -- relative to --;
Line 15, "diffusion" should read -- diffusion current --;
Line 25, "ratio $n_{FE}$" should read -- ratio $h_{FE}$ --;
Line 41, "life $T_p$" should read -- life $\tau_p$ --;
Line 42, "holed)." should read -- holes). --;
Line 49, "n-type" should read -- n-type) --.

Column 8,
Line 12, "spurttering," should read -- sputtering, --;
Line 23, "made" should read -- be made --;
Line 27, "$Eq \cong 2.2$ [eV]" should read -- $Eg \cong 2.2$ [eV] --;
Line 46, "depeleted" should read -- depleted --.

Column 9,
Line 14, "circuit example" should read -- circuit diagram --;
Line 48, "apply" should read -- apply to --;
Line 56, "ratios" should read -- ratio --.

Column 12,
Line 40, "$Sl_3N_4$" should read -- $Si_3N_4$ --.

Signed and Sealed this

Seventh Day of May, 2002

*Attest:*

JAMES E. ROGAN
*Director of the United States Patent and Trademark Office*

*Attesting Officer*